United States Patent [19]

Feldman

[11] Patent Number: 5,123,743

[45] Date of Patent: Jun. 23, 1992

[54] LITHOGRAPHY MASK INSPECTION

[75] Inventor: Martin Feldman, Baton Rouge, La.

[73] Assignee: Board of Supervisors of Louisiana State University and Agricultural and Mechanical College, Baton Rouge, La.

[21] Appl. No.: 486,504

[22] Filed: Feb. 28, 1990

[51] Int. Cl.⁵ ............................................. G01B 11/02
[52] U.S. Cl. ................................... 356/394; 356/237
[58] Field of Search ............... 356/237, 394; 350/414, 350/418, 507; 358/34, 35, 58; 359/661, 665, 625

[56] References Cited

U.S. PATENT DOCUMENTS

| | | | |
|---|---|---|---|
| 1,135,919 | 4/1915 | Pilkington . | |
| 3,648,587 | 3/1972 | Stevens | 350/447 |
| 4,586,822 | 5/1986 | Tanimoto | 356/394 |
| 4,718,767 | 1/1988 | Hazama | 356/381 |

OTHER PUBLICATIONS

Chamot et al, "Handbook of Chemical Microscopy," vol. I, 1930, pp. 23–25.
Liu et al., "Study of Aging Effects in a Chemical Amplification Resist: SAL601-ER7," J. Vac. Sci. Techno. B, vol. 7, No. 6, Nov./Dec. 1989, pp. 1740–1744.

*Primary Examiner*—F. L. Evans
*Assistant Examiner*—K. P. Hantis
*Attorney, Agent, or Firm*—John H. Runnels

[57] ABSTRACT

A method of detecting defects in a lithography mask by exposing a first mask onto a positive resist, and a second, ostensibly identical mask onto a negative resist. Remaining particles of resist after development correspond to spots in the first mask, or to holes in the second mask. The process may be repeated with the tones of the resists reversed to detect holes in the first mask, or spots in the second mask.

12 Claims, 3 Drawing Sheets

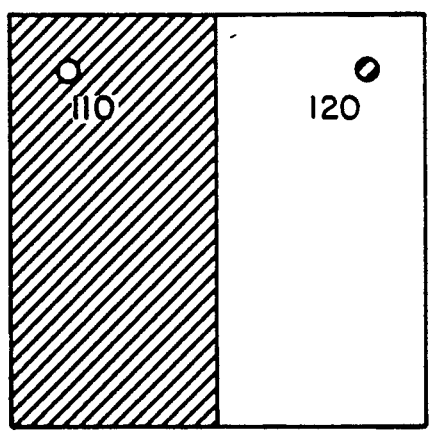
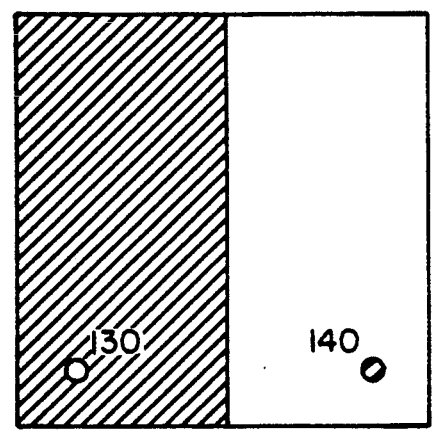
FIGURE 2(a) FIGURE 2(b)

LITHOGRAPHY MASK INSPECTION

BACKGROUND OF THE INVENTION

This invention pertains to the detection of defects in lithography masks, particularly in x-ray lithography masks.

The linewidth of circuit elements in integrated circuits has decreased considerably in recent years; the current state of the art is a linewidth of about 1 micron, and the state of the art may reach linewidths of 0.25 to 0.5 micron within the next five years. Optical techniques for producing circuit elements with such narrow linewidths encounter serious difficulties from diffracton effects.

X-ray lithography has been used to make patterns with narrower linewidths than are possible with optical techniques. The optimum x-ray wavelength for such lithography has been found to be about 10 Angstroms.

Defects on the masks used for such lithography are a serious problem. The present state of the art in producing adequately defect-free masks is poor, being about 30 defects per cm$^2$. (A defect is a pinhole, an opaque area, or other irregularity of a size at least on the order of $\frac{1}{4}$ the linewidth of the circuit.) Because an integrated circuit may have 10 levels on a 1 cm$^2$ chip, there should ideally be no more than 0.1 defect per cm$^2$ on the mask.

Thus there exists a need for more defect-free masks, a need to repair masks which have defects, and there particularly exists a need for an improved method of inspecting x-ray masks to identify and locate defects.

Inspection serves at least three functions: (1) to improve process control in making masks, (2) to identify defects on a mask for making repairs, and (3) to qualify masks before use in manufacturing chips.

There are two principal types of mask defects: (1) a spot, an area that absorbs radiation where it should not, and (2) a hole, an area that does not absorb radiation where it should. These defects may lie in unpatterned areas, patterned areas, or on feature edges. There can also be hybrids or combinations of these two principal types of defects. An apparent optical defect may not be an x-ray defect. For example, a dust speck on a mask may be optically visible but x-ray transparent. Similarly, an x-ray defect may not be apparent optically.

Other than direct optical inspection, which is lengthy, tedious, and inaccurate, there have been at least three prior approaches to x-ray mask inspection. The first is inspection of the mask with an electron beam in reflection or transmission. The response of a mask to electrons is not identical to its response to x-rays, however, and data rates are slow--an inspection could, in principle, take weeks.

The second, and more commonly used, prior method of mask inspection is to make a copy with the mask, and to inspect the copy. This technique is exemplified by Hazama, U.S. Pat. No. 4,718,767. Typically a copy of the mask will be made on a transparent wafer coated with a photosensitive layer, and after development the resulting pattern on the wafer will be optically inspected. Existing optical inspection techniques pass light, typically blue light of wavelength 0.4 or 0.5 micron, through the printed pattern onto an electronic detector, and a comparison of the resulting signal is made either to a software representation of what the circuit ideally should be, or to a comparable signal from a second, ostensibly identical mask. Alternatively, typical characteristics of printed defects, such as improper linewidth or edge characteristics, are extracted from the signal. However, it is difficult using this technology to detect defects smaller than about $\frac{1}{2}$ to 1 micron, both because of the wavelength of the light used in inspection, and because of the complexity of observing and separating the defect from the larger pattern in which the defect lies.

The third prior method of mask inspection is that of Tanimoto, U.S. Pat. No. 4,586,822. This reference discloses a photosensitive layer on a wafer through a first positive mask, and then through a first negative mask of the same circuit or pattern. Each mask is carefully aligned in the same position, so that if a positive resist on the wafer is used, after development the wafer will have only islands of resist remaining, corresponding to areas which are opaque in both masks. Thus some of these islands correspond to spots in the first positive mask, but holes in that mask are not detected. This reference also discloses a method of detecting holes in the first positive mask, by replicating the entire pattern of the first positive mask onto a negative photoresist, and creating a second negative mask which is a negative of the first positive mask. Similarly, a second positive mask is created which is a negative of the first negative mask. The second positive and negative masks are then printed on a resist as the first masks were, and after development islands of resist will remain, some of which will correspond to spots in the second negative mask, some of which in turn will correspond to holes in the first positive mask. The islands of resist remaining are detected by the scattering of laser light in a dark field. The scattering will detect edges of the islands, but will not directly detect interiors of larger islands. The technique of this reference has the disadvantages (1) that extra masks must be generated in addition to those to be used directly in actual printing, and (2) that spurious results may arise—some new defects may be introduced in the extra copying steps, and some defects may not be completely copied in the extra copying steps, and therefore may not be detected.

Pilkington, U.S. Pat. No. 1,135,919 discloses a method for detecting forgeries by projecting a negative image of a suspected forgery onto a standard positive enlargement, and observing light areas, which would indicate distortions. This technique, from a nonanalogous art, was designed primarily to detect distortions in forgeries rather than small defects; is not directly usable in lithography; does not use a photosensitive material in the detection step per se; would not identify distortions corresponding to holes in the original, positive, suspected forgery; and requires the creation of extra, intermediate images not otherwise usable, allowing the possibility of creating new, spurious errors in that intermediate creation step.

SUMMARY OF THE INVENTION

The process of the present invention overcomes these disadvantages by making two exposures on the same wafer, one through a first mask onto a positive resist on the wafer, and one through a second, ostensibly identical, mask onto a negative resist on the same wafer. The first and second masks may in fact be different, ostensibly identical, patterned portions of the same mask. Both masks have the same tone, i.e., both are either positive or negative, and ordinarily both masks are suitable for direct use in printing. The process is repeated on a second wafer, or on a different portion of the first wafer, with the resist tones reversed. Defects appear as islands remaining in an otherwise predominantly clear area.

The developed area corresponding to the first set of exposures will have islands of resist corresponding to spots in the first mask, or to holes in the second mask. The developed area corresponding to the second set of exposures will have islands of resist corresponding to holes in the first mask, or to spots in the second mask. The ambiguities in the location and type of defect may then be resolved either by direct inspection of the masks in the identified locations, or by comparing either mask to a third, ostensibly identical mask through the use of the same technique.

The present invention has the advantages (1) that both holes and spots are efficiently detected by using only masks which may also be used directly for actual printing, (2) that no extra steps are required to make masks useful only in the inspection process but not for printing, and (3) that the opportunities for spurious results are reduced through eliminating the step of creating intermediate masks used only in the inspection.

BRIEF DESCRIPTION OF THE DRAWING

FIGS. 2(a) and 2(b) illustrate intermediates in the preparation of inspection wafers from the masks of FIGS. 1(a) and 1(b).

DETAILED DESCRIPTION OF THE INVENTION

In the technique of the present invention, two ostensibly identical masks A and B are compared to one another by making two patterns—for example, patterns in chrome on a glass wafer. In pattern 1, mask A is exposed with x-rays on a positive resist on a transparent wafer, and mask B is then aligned as mask A was, and is exposed on a negative resist on the same wafer. In pattern 2, mask B is exposed on a positive resist on a different wafer, or a different part of the same wafer, and mask A is exposed on a negative resist. Conventional processing is used to develop the chrome following these exposures. Both patterns are then substantially free of chrome in all areas where mask A and mask B are substantially identical. Masks A and B may be ostensibly identical portions of the same mask.

Pattern 1 will have residual chrome in places where mask A has spots, or where mask B has holes. Pattern 2 will have residual chrome in places where mask B has spots, or where mask A has holes.

Figure 1A:
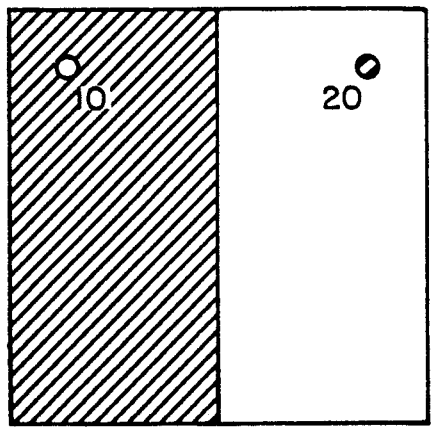
FIGS. 1(a) and 1(b) illustrate two masks with defects.
Figure 1B:
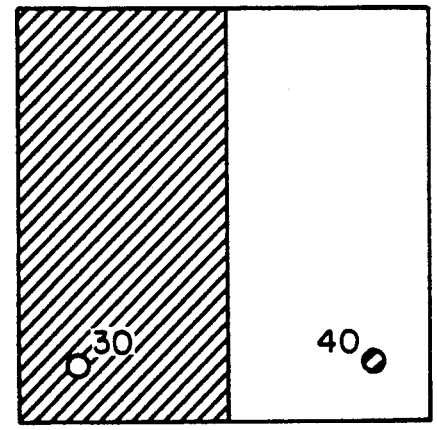

This process is illustrated in FIGS. 1, 2, and 3. FIGS. 1(a) and 1(b) depict ostensibly identical masks A and B, respectively. A has a hole 10 and a spot 20, while B has a hole 30 and a spot 40.

FIGS. 2(a) and 2(b) show patterns 1 and 2, respectively, after exposing and developing masks A and B, respectively, on positive resist. Hole 110 in pattern 1 corresponds to hole 10 in mask A; spot 120 in pattern 1 corresponds to spot 20 in mask A; hole 130 in pattern 2 corresponds to hole 30 in mask B; and spot 140 in pattern 2 corresponds to spot 40 in mask B.

Figure 3A:
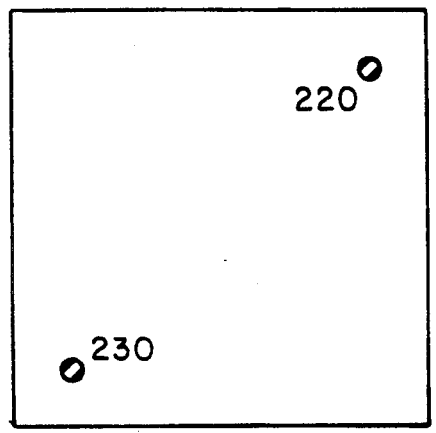
FIGS. 3(a) and 3(b) illustrate completed inspection wafers prepared from the masks of FIGS. 1(a) and 1(b).
Figure 3B:
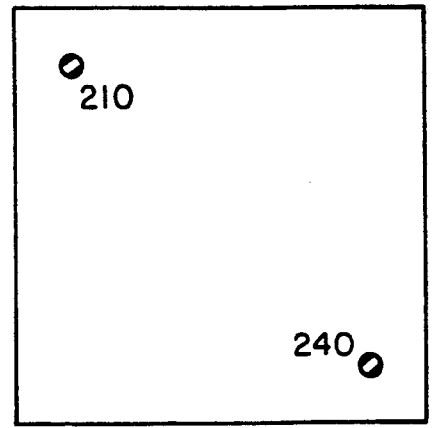

FIGS. 3(a) and 3(b) show patterns 1 and 2, respectively, after subsequently exposing and developing masks B and A, respectively, on negative resist. Spot 220 in pattern 1 corresponds to spot 20 in mask A; spot 230 in pattern 1 corresponds to hole 30 in mask B; spot 210 in pattern 2 corresponds to hole 10 in mask A; and spot 240 in pattern 2 corresponds to spot 40 in mask B.

Note that it should be inconsequential whether the negative resist step precedes the positive resist step, or vice versa.

The number of separate steps required may be minimized by simultaneously or sequentially making the negative exposures for each of the two patterns on different parts of the same wafer, followed by a single development of the negative resist. Then the positive exposures for each of the two patterns are made, simultaneously or sequentially, followed by a single development of the positive resist.

Once the locations of any defects are established, the ambiguity in the type of defect, and the location of the defect, can be resolved by either (1) a new comparison by the same technique with a third, ostensibly identical mask, or (2) direct inspection of a different, singly-exposed pattern on a wafer at the locations thus identified with an optical microscope.

The images of features from one or both masks on the chrome may be deliberately made slightly larger than they otherwise would be, to allow for the tolerance of the alignment. Various methods of controlling feature width are well-known in the art. The state of the art in alignment is about ± 0.1 micron (within three standard deviations). If a total "guard band", or enlargement, of 0.1 micron is used in the images, and the alignment is more precise than 0.1 micron, then defects as small as 0.1 micron will be observable by this technique. The accuracy of the inspection is thus limited by the accuracy of the relative alignment of the two masks.

The linewidth of the "guard band" or enlargement is preferably between 0.01 micron and 0.5 micron, more preferably between 0.05 micron and 0.2 micron.

Techniques for alignment are known in the art, and are shown, for example, in D. L. White, M. Feldman, T. E. Saunders, and P. Gunter, "The Interference Fringe Aligner," *J. Vac. Sci. and Technol. B*, vol. 6, pp. 1921-1924 (November 1988), which is incorporated by reference.

The effects of exposure time, development time, developer dilution, and other development conditions on the linewidth of the image are known in the art, and are shown, for example, in R. Hershel and C. A. Mack, "Lumped Parameter Model for Optical Lithography," VLSI Electronics Microstructure Science, vol. 16, Lithography for VLSI, Academic Press, Orlando, pp 19-55 (1987), which is incorporated by reference.

The spots of chrome remaining on the wafer after the positive and negative images have been superimposed will typically be in the range of 0.1 to 10 microns, so the spots may both reflect and scatter visible light. The spots do not need to be resolved optically, however, but need only be detected. The spots of chrome may be located with high efficiency with an optical microscope with an immersion lens, top lighting, and bright field. A drop of refractive index-matching oil contacting both the lens and the glass or other surface eliminates reflections from the glass, so only light scattering or reflecting from the chrome is seen. The refractive index-matching oil or other liquid has a refractive index substantially indentical to that of the glass or other surface. It is believed that this method of detection will better locate interior areas of spots than the laser light, dark-field detection method of U.S. Pat. No. 4,586,822, although no experiments to test this belief have been conducted as of the filing date of this application.

A layer "underlying" a resist is one on the oposite side of the resist from a radiation source.

Although chrome is used in the embodiment of this invention described above, it will be readily understood that the process of this invention encompasses the use of any photoresist, photochromic dye, etc. with sufficient resolution.

I claim:

1. A process for inspecting lithography masks, comprising the stes of:
   (a) irradiating a surface having a positive resist through a first mask having a first pattern;
   (b) developing a first image on the surface corresponding to the first pattern;
   (c) irradiating the surface, having a negative resist, through a second mask having a second pattern, wherein the first and second patterns are substantially similar, and wherein the alignment of the second pattern relative to the surface during said irradiating step through the second pattern is substantially identical to the alignment of the first pattern relative to the surface during said irradiating step through the first pattern;
   (d) developing a second image on the surface corresponding to the negative of the second pattern, whereby the resulting new image on the surface contains areas which correspond to differencces between the two patterns; and
   (e) inspecting the resulting net image to determine the location of such areas.

2. A process as recited in claim 1, additionally comprising the step for detecting the net image by observing light scattered from the net image.

3. A process as reited in claim 2, wherein said observing is performed through an optical microscope with top lighting, bright field, and an objective immersion lens with a refractive index-matching liquid, which liquid eliminates substantially reflections from the surface.

4. A process as recited in claim 1, wherein each of the first and second images has an associated linewidth, and wherein the linewidths of the first and second images are between 0.01 micron and 0.5 micron larger than the linewidths are when said irradiating steps are optimally collimated and focused.

5. A process as recited in claim 4, wherein the linewidths of the first and second images are between 0.05 micron and 0.2 micron larger than the linewidths are when said irradiating steps are optimally collimated and focused.

6. A process as recited in claim 1, wherein the net image comprises a reflective material.

7. A process as recited in claim 6 wherein said reflective material comprises chrome.

8. A process as recited in claim 1, wherein said resists comprise x-ray resists, and wherein each of said irradiating steps comprises irradiating the surface with x-ray radiation.

9. A process as recited in claim 1, additionally comprising the step of comparing the first pattern or the second pattern with a substantially similar third pattern on a third mask through the steps recited in the process of claim 1.

10. A process as recited in claim 1, additionally comprising the steps of:
    (a) irradiating a second surface having a negative resist through the first mask;
    (b) developing a third image on the second surface corresponding to the negative of the first pattern;
    (c) irrdiating the second surface, having a positive resist, through the second mask, wherein the alignment of the second pattern relative to the second surface during said irradiating step through the second pattern is substantially indentical to the alignment of the first pattern relative to the second surface during said irradiating step through the first pattern;
    (d) developing a fourth image on the second surface corresponding to the second pattern, whereby the resulting net image on the second surface contains second areas which correspond to differences between the two patterns; and inspecting the resulting net image on the second surface to determine the location of such second areas.

11. A process as recited in claim 10, wherein said resists comprise x-ray resists, and wherein each of said irradiating steps comprises irradiating the surface with x-ray radiation.

12. A process as recited in claim 10, additionally comprising the step of comparing the first pattern or the second pattern with a substantially similar third pattern on a third mask through the steps recited in the process of claim 11.

* * * * *